United States Patent
Nonomura et al.

(10) Patent No.: US 8,237,367 B2
(45) Date of Patent: Aug. 7, 2012

(54) PLASMA TREATMENT APPARATUS AND PLASMA TREATMENT METHOD

(75) Inventors: Masaru Nonomura, Fukuoka (JP); Tatsuhiro Mizukami, Saga (JP)

(73) Assignee: Panasonic Corporation, Osaka (JP)

( * ) Notice: Subject to any disclaimer, the term of this patent is extended or adjusted under 35 U.S.C. 154(b) by 256 days.

(21) Appl. No.: 12/738,854

(22) PCT Filed: Nov. 27, 2008

(86) PCT No.: PCT/JP2008/003489
§ 371 (c)(1),
(2), (4) Date: Apr. 20, 2010

(87) PCT Pub. No.: WO2009/069298
PCT Pub. Date: Jun. 4, 2009

(65) Prior Publication Data
US 2010/0243470 A1   Sep. 30, 2010

(30) Foreign Application Priority Data
Nov. 30, 2007   (JP) ................ 2007-309766

(51) Int. Cl.
*H01J 7/24* (2006.01)

(52) U.S. Cl. .............. 315/111.21; 156/345.33; 216/67

(58) Field of Classification Search ............ 156/345.24, 156/345.43, 345.44; 216/67, 71; 315/111.01, 315/111.21
See application file for complete search history.

(56) References Cited

U.S. PATENT DOCUMENTS

| | | | |
|---|---|---|---|
| 6,041,734 A * | 3/2000 | Raoux et al. ........... 118/723 E |
| 6,162,709 A * | 12/2000 | Raoux et al. ............. 438/513 |
| 6,358,573 B1 * | 3/2002 | Raoux et al. ............. 427/578 |
| 8,128,831 B2 * | 3/2012 | Sato et al. ................ 216/41 |
| 2003/0097984 A1 | 5/2003 | Nakano et al. |
| 2005/0194094 A1 | 9/2005 | Yasaka |

FOREIGN PATENT DOCUMENTS

| | | |
|---|---|---|
| JP | 2003-229409 | 8/2003 |
| JP | 2003-229409 A | 8/2003 |
| JP | 2003-273035 A | 9/2003 |
| JP | 2003-318115 A | 11/2003 |
| JP | 2007-149597 | 6/2007 |

OTHER PUBLICATIONS

International Search Report for PCT/JP2008/003489, Feb. 3, 2009.

* cited by examiner

*Primary Examiner* — Thuy Vinh Tran
(74) *Attorney, Agent, or Firm* — RatnerPrestia

(57) ABSTRACT

According to the plasma treatment on an object accommodated in the processing room, the plasma treatment is carried out as follows. The discharge detecting sensor detects a signal of potential change caused with change in plasma discharge. Receiving the signal, the signal recording section temporarily records the signal as signal data indicating potential change. Referencing the signal data, the signal analysis section extracts index data. The index data shows a condition of plasma discharge, for example, as a count value for discharge-start waves, a count value for abnormal discharge, a count value for feeble arc discharge. The device control section judges a condition of plasma discharge by monitoring the index data and carries out the retry process, the accumulative plasma process, and the maintenance judgment process for performing plasma treatment operations properly.

3 Claims, 8 Drawing Sheets

PLASMA TREATMENT APPARATUS AND PLASMA TREATMENT METHOD

This application is a U.S. National Phase Application of PCT International Application PCT/JP2008/003489, filed Nov. 27, 2008, claiming the priority benefit of application No. Japan 2007-309766, filed Nov. 30, 2007.

TECHNICAL FIELD

The present invention relates to a device and a method for plasma treatment on an object, such as a substrate.

BACKGROUND ART

Plasma treatment is well known as a surface treatment method, such as cleaning and etching, on an object to be processed, for example, a substrate on which electronic components are mounted. In plasma treatment, a substrate as an object to be processed is set in a vacuum chamber that forms a treatment room, and plasma discharge is generated in the treatment room. Ions and electrons generated by plasma discharge allow the object to have a predetermined surface treatment. For plasma treatment with high quality and stability, plasma discharge has to be generated suitable for discharge conditions determined in advance so as to fulfill a processing purpose.

To check for a generating state of plasma discharge, various methods have been employed. For example, followings are well known: a method for finding an influence on voltage and current of a high-frequency power supply section due to changes in plasma discharge from any cause, and a method for judging a discharge condition by detecting self bias voltage generated between electrodes by the plasma discharge.

According to the methods above, however, when plasma discharge has to be generated under low-output conditions, accurate detection of the discharge condition cannot be expected due to poor detection accuracy. In that case, a method capable of directly detecting changes in condition of plasma discharge is employed. Specifically, a discharge detecting sensor is disposed in the vacuum chamber of the processing room. The discharge detecting sensor has a probe electrode for detecting change in electrical potential caused with change in plasma discharge, thereby detecting an abnormal discharge in the processing room. Through the method, change in condition of plasma discharge in the processing room can be detected with high sensitivity. Therefore, in principle, even when the high-frequency power supply section supplies low output, the presence or absence of plasma discharge and abnormal discharge is properly monitored. The method is introduced in patent literature 1.

However, patent literature 1 has no specific description on the followings: a specific example of application required for monitoring with high accuracy of the presence or absence of plasma discharge and discharge abnormalities; a problem of having no normal discharge at the start of the device; and measures against an abnormal discharge occurred during operations.

Patent literature 1: Japanese Patent Application Publication No. 2003-318115

SUMMARY OF THE INVENTION

The present invention provides a device and a method for plasma treatment capable of monitoring the presence or absence of plasma discharge and discharge abnormalities, and coping properly with a problem.

According to the plasma treatment device of the present invention, an object to be processed is accommodated in a processing room for plasma treatment. The device has a vacuum chamber that forms a processing room, an electrode section disposed in the processing room, a vacuum evacuation section that evacuates the processing room of air, a gas supply section that supplies the processing room with gas for generating plasma, a high-frequency power supply section that generates plasma discharge by applying high-frequency voltage to the electrode section, a matching device that matches the impedance of the high-frequency power supply section to that of plasma discharge circuits for generating plasma discharge, a discharge detecting sensor that has at least a plate-like dielectric member fixed to the vacuum chamber so that one surface of the dielectric member faces plasma discharge generated in the processing room and a probe electrode disposed on the other surface of the dielectric member, a signal recording section that receives a signal indicating potential change, which is caused with changed in plasma discharge and is induced in the probe electrode, and temporarily records the signal as signal data, a signal analysis section that extracts index data showing the condition of plasma discharge, with reference to the signal data recorded in the signal recording section, and a device control section that effects control of the vacuum evacuation section, the gas supply section, and the high-frequency power supply section so as to carry out plasma treatment operations; at the same time, through the monitoring of the index data extracted by the signal analysis section, the device control section judges the condition of plasma discharge and carries out a predetermined process for performing plasma treatment operations properly. The signal analysis section detects potential change that occurs in the following cases: the potential change at the start of discharge that shows normal start of plasma discharge in the processing room; the potential change with abnormal discharge that shows generation of abnormal plasma discharge in the processing room; and the potential change with a feeble arc-discharge caused by foreign matters attached or accumulated in the processing room. Calculating frequency of occurrence of the potential changes above, the signal analysis section extracts index data. The device control section carries out at least any one of the processes below:

a retry process that repeatedly carries out discharge start operation when plasma discharge has not a normal start;

a plasma resuming process that resumes plasma treatment on the currently processing object after interruption of plasma treatment in the wake of detection of abnormal discharge; and a maintenance judgment process that judges whether taking measures against the foreign matters is needed or not.

The device and method of the present invention carries out plasma treatment with the following procedures:

receiving a signal indicating potential change, which is caused with change in plasma discharge and induced in a probe electrode disposed in the processing room, and recording the signal temporarily as signal data that shows potential change;

extracting index data indicating the condition of plasma discharge with reference to the recorded signal data;

judging the condition of plasma discharge by monitoring the extracted index data; and carrying out a predetermined process according to the judgment so as to perform plasma treatment operations properly.

With the procedures above, the device properly monitors the presence or absence of plasma discharge and abnormal discharge. Therefore, appropriate measures against problems or necessity of maintenance can be judged on real-time basis.

Figure 1:
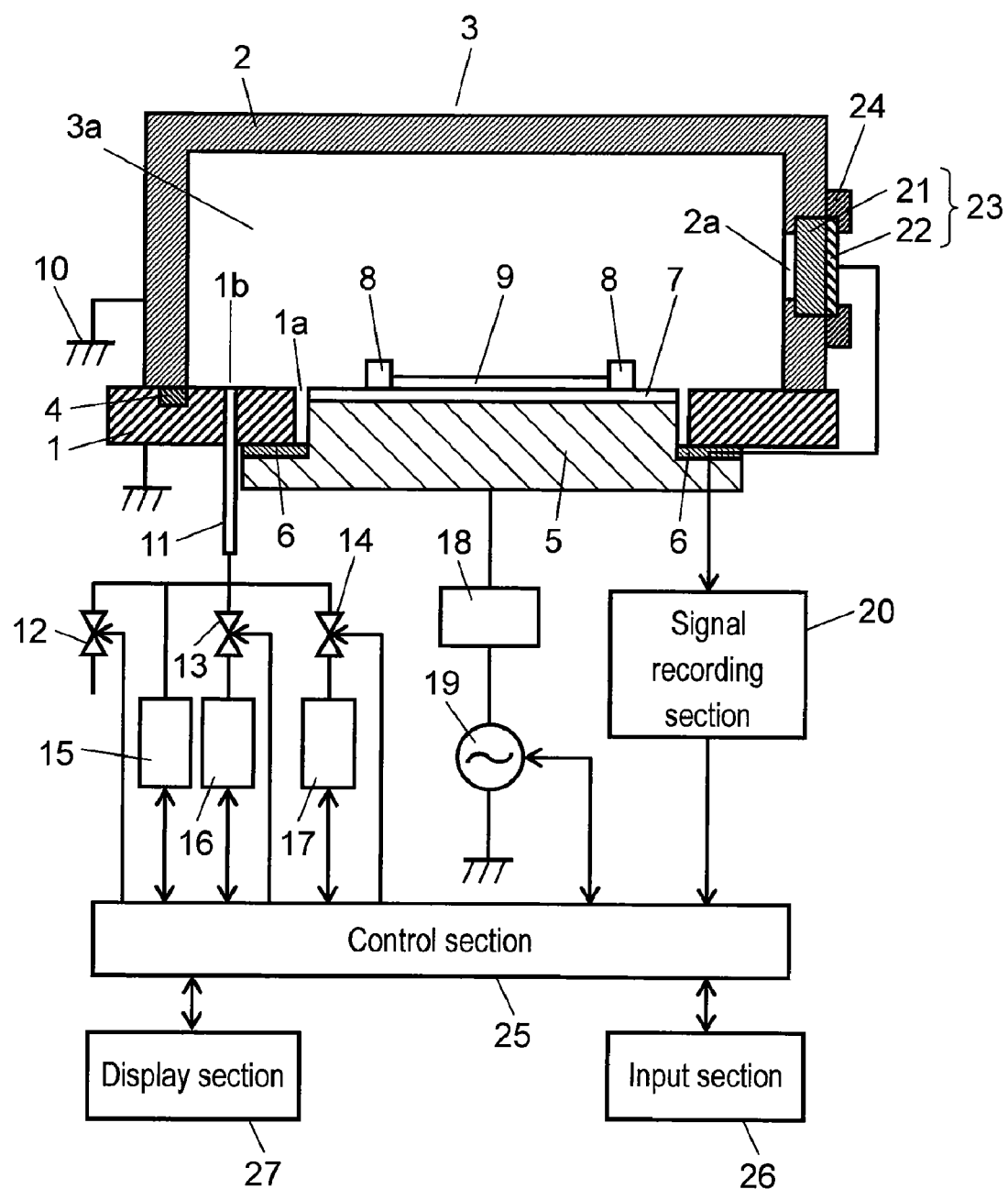
FIG. 1 is a sectional view showing a plasma treatment device in accordance with an exemplary embodiment of the present invention.

REFERENCE MARKS IN THE DRAWINGS 2 lid
2a opening (peephole)
3 vacuum chamber
3a processing room
5 electrode section
8 guide member
9 substrate
15 vacuometer
16 gas supply section
17 vacuum pump
18 matching device
19 high-frequency power supply section
21 dielectric member
22 probe electrode unit
22b probe electrode
23 discharge detecting sensor

DETAILED DESCRIPTION OF THE PREFERRED EMBODIMENTS

Exemplary Embodiment

FIG. 1 is a sectional view showing a plasma treatment device in accordance with the exemplary embodiment of the present invention. In FIG. 1, vacuum chamber 3 is disposed on level base section 1 so that lid 2 is movable up and down by elevating means (not shown). In a state where lid 2 moves down and contacts to the upper surface of base 1 via seal member 4, vacuum chamber 3 keeps a closed condition. That is, the space enclosed by base 1 and lid 2 forms processing room 3a for accommodating an object that undergoes plasma treatment. Electrode section 5 is disposed in processing room 3a. Specifically, electrode section 5 is fixed, from downward direction, to opening 1a disposed in base 1 via insulating member 6. Insulator 7 is attached on the upper surface of electrode section 5. Substrate 9 as an object to be processed is carried into the processing room in a substrate-carrying direction (i.e., in a direction vertical to FIG. 1 on the paper), with the ends of both sides guided by guide member 8 on insulator 7.

Base 1 has hole 1b to which vent valve 12, vacuometer 15, gas supply valve 13, and vacuum valve 14 are connected through conduit line 11. Gas supply valve 13 and vacuum valve 14 are further connected to gas supply section 16 and vacuum pump 17, respectively. Processing room 3a is evacuated when vacuum valve 14 is opened under the driving state of vacuum pump 17. The degree of vacuum at that time is detected by vacuometer 15. Vacuum valve 14 and vacuum pump 17 constitutes the vacuum evacuation section for evacuating air from processing room 3a. When gas supply valve 13 is opened, gas for generating plasma is fed into processing room 3a from gas supply section 16. Gas supply section 16 having a flow control function supplies processing room 3a with a discretional amount of gas for generating plasma. When vacuum break is needed, setting vent valve 12 to the open position allows the air to flow into processing room 3a.

Electrode section 5 has electrical connections to high-frequency power supply section 19 via matching device 18. When high-frequency power supply section 19 is driven under the condition where gas for generating plasma is fed from gas supply section 16 into processing room 3a having undergone vacuum evacuation, high-frequency voltage is applied between electrode section 5 and lid 2 that is connected to ground section 10. The application of voltage generates plasma discharge in processing room 3a. Matching device 18 matches the impedance of high-frequency power supply section 19 to that of a plasma discharge circuit for generating plasma discharge in processing room 3a.

Lid 2 has round opening 2a in a side surface. Opening 2a serves as a peephole that allows an operator outside vacuum chamber 3 to have visual inspection inside processing room 3a. Discharge detecting sensor 23, which is formed of dielectric member 21 and probe electrode unit 22, is disposed at opening 2a. Discharge detecting sensor 23 is fixed at the outside of lid 2 by supporting member 24.

Figure 2:
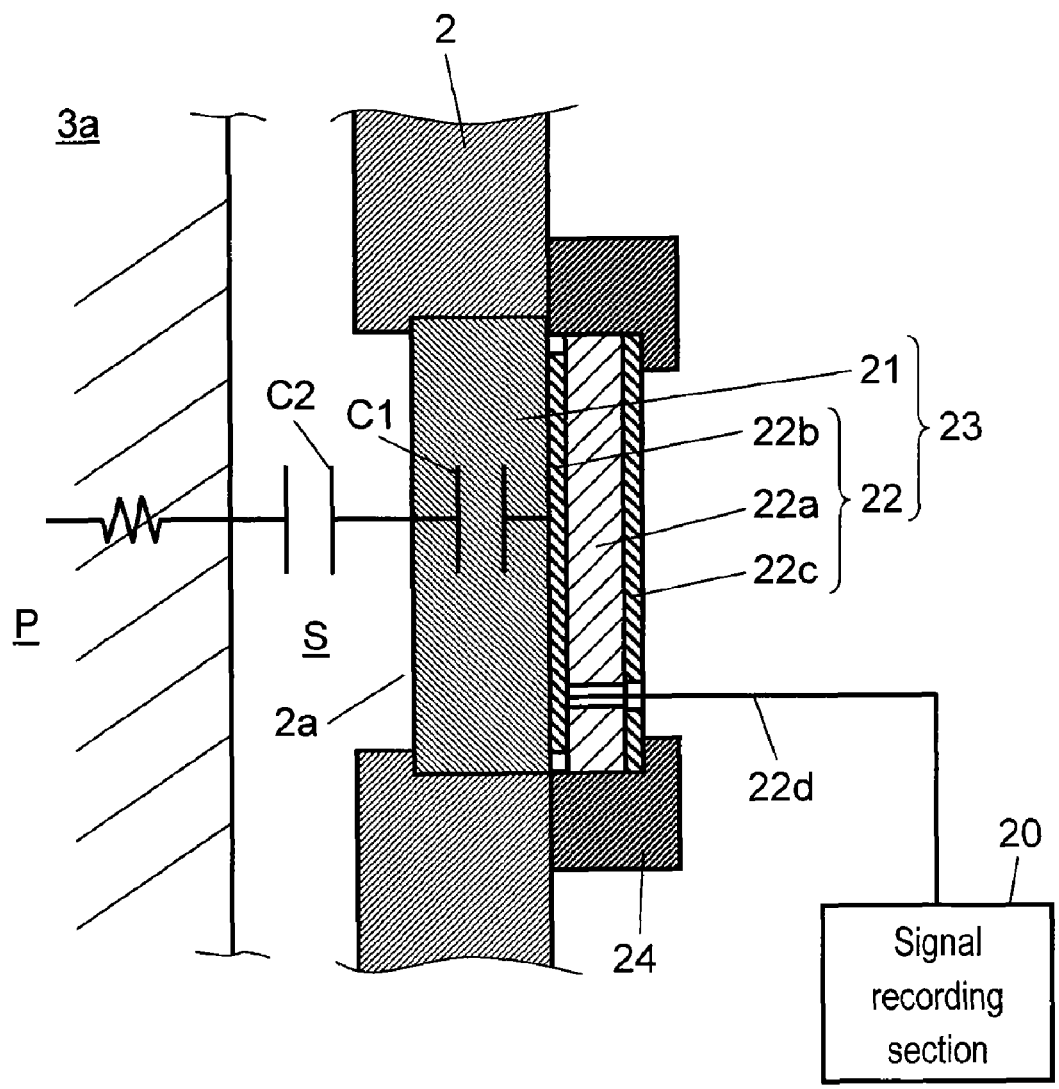
FIG. 2 illustrates the structure of the discharge detecting sensor used for the plasma treatment device in accordance with the exemplary embodiment of the present invention.

FIG. 2 illustrates the structure of the discharge detecting sensor used for the plasma treatment device in accordance with the exemplary embodiment of the present invention. In FIG. 2, dielectric member 21 made of optically transparent glass is disposed at opening 2a in lid 2. In processing room 3a, plasma discharge is generated between electrode section 5 and lid 2. Dielectric member 21 is disposed at opening 2a of vacuum chamber 3 in a way that one surface of member 21 faces plasma discharge generated in processing room 3a.

On the other surface of dielectric member 21, that is, on the surface farther from vacuum chamber 3, probe electrode unit 22 is attached. Probe electrode unit 22 is an integrated component made of glass plate 22a in which probe electrode 22b is formed on one surface and shield electrode 22c is formed on the other surface. Discharge detecting sensor 23, which is formed of dielectric member 21 and probe electrode unit 22, is supported by supporting member 24 made of conductive metal so as to be fixed to lid 2, with probe electrode 22b being in close contact with the outer surface (i.e., the other surface mentioned above) of dielectric member 21. That is, discharge detecting sensor 23 has at least plate-like dielectric member 21, which is disposed to vacuum chamber 3 in a manner that one surface of dielectric member 21 faces plasma discharge generated in processing room 3a, and probe electrode 22b disposed on the other surface of member 21. Probe electrode 22b is connected to signal recording section 20 via detection lead wire 22d.

Under the condition in which plasma discharge is generated in processing room 3a, probe electrode 22b is electrically connected to plasma P generated in processing room 3a via sheath S. Sheath S is a space-charge layer formed at interface between plasma P and dielectric member 21. That is, an electric circuit—capacitor C1 formed by dielectric member 21, capacitor C2 with a capacitance corresponding to sheath S, and resistor R of plasma P connected in series—is formed in the structure shown in FIG. 2. As a result, probe electrode 22b has an electrical potential according to the condition of plasma P. In the structure of the embodiment, the electrical potential induced in probe electrode 22b is transmitted to signal recording section 20 by detection lead wire 22d. Signal recording section 20 temporarily records the signal of potential change corresponding to the condition of plasma P. As described above, signal recording section 20 receives the signal of potential change, which is generated with change in plasma discharge and induced in probe electrode 22b, and temporarily records the signal as signal data.

If abnormal discharge occurs in an area adjacent to substrate 9 mounted on electrode section 5 in processing room 3a, the condition of plasma P inside processing room 3a changes. The change in condition of plasma P changes the impedance of the aforementioned circuit, which is detected as potential change in probe electrode 22b. The structure of the embodiment detects a potential change—even if it is subtle and therefore cannot be detected by a conventional detection—with extremely high sensitivity and accuracy. Shield electrode 22c electrically shields the outer side of probe electrode 22b. Electric charge produced in shield electrode 22c is transferred through conductive-metal-made supporting member 24 to lid 2 connected to the ground. This reduces noise caused with the potential change induced in probe electrode 22b.

According to the embodiment, both of probe electrode 22b and shield electrode 22c are formed in a manner that a transparent conductive material, such as ITO, is film-coated over the surface of glass plate 22a. In the structure with discharge detecting sensor 23 attached to opening 2a, the structure made of transparent material enables an operator to have visual inspection inside processing room 3a through opening 2 from outside lid 2. That is, discharge detecting sensor 23 of the embodiment has dielectric member 21 made of optically transparent glass and probe electrode 22b made of optically transparent conductive material so as to provide visual inspection inside processing room 3a when sensor 23 is attached to opening 2a (peephole).

The structure above thus doubles a peephole for inspecting inside processing room 3a and probe electrode 22b for monitoring the condition of plasma discharge. Dielectric member 21 needs replacing at predetermined intervals because the surface can be damaged due to a constant exposure to plasma P in processing room 3a. However, in this case, replacing dielectric member 21 is all that is needed; it is no need for replacing probe electrode 22 because they are formed as separate components from each other.

The plasma treatment device has control section 25 for governing whole operations. Control section 25 effects control of vent valve 12, gas supply valve 13, vacuum valve 14, vacuometer 15, gas supply section 16, vacuum pump 17, and high-frequency power supply section 19, carrying out operations required for plasma treatment. In addition, control section 25 not only effects writing control of memory 20c of signal recording section 20 but also carries out signal analysis (that will be described below) with reference to signal data recorded in memory 20c.

Control section 25 has input section 26 and display section 27. Input section 26 enables an operator to have data-entry operations for plasma treatment. Display section 27 shows an operation for each input operation and a judgment result that is judged by control section 25 according to signal data recorded in signal recording section 20.

Figure 3:
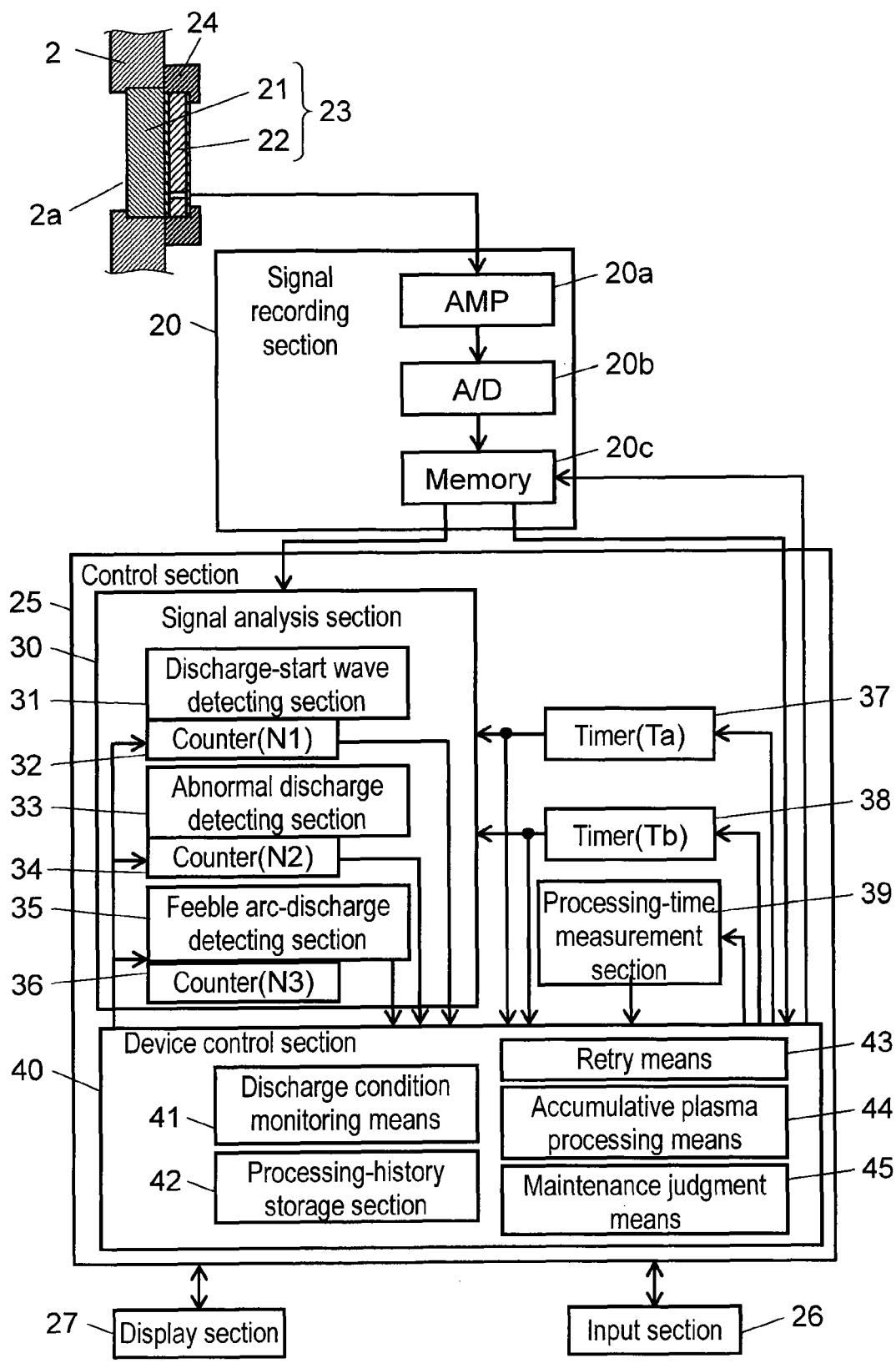
FIG. 3 is a block diagram showing the structure of the control system of the plasma treatment device in accordance with the exemplary embodiment of the present invention.

FIG. 3 is a block diagram showing the structure of the control system of the plasma treatment device in accordance with the exemplary embodiment of the present invention. In FIG. 3, signal recording section 20 has AMP (amplifier) 20a, A/D converter 20b, and memory 20c. AMP 20a amplifies potential change in probe electrode 22b, which has been transmitted through detection lead wire 22d. Receiving the amplified signal of potential change from AMP 20a, A/D converter 20b provides the signal with A/D conversion. The signal having undergone A/D conversion by A/D converter 20b, i.e., the digital signal corresponding to the voltage change is temporarily recorded in memory 20c according to the writing control of control section 25. When control section 25 issues a clear command, the record is cleared.

Control section 25 has signal analysis section 30, timer (Ta) 37, timer (Tb) 38, processing-time measurement section 39, and device control section 40. Signal analysis section 30 extracts index data indicating the condition of plasma discharge generated in processing room 3a, with reference to the signal data recorded in memory 20c of signal recording section 20. Referencing a signal data recorded in memory 20c at extremely short intervals, signal analysis section 30 acquires index data indicating the condition of plasma discharge in nearly real time. The advantageous features above is obtained by signal analysis section 30 having following components: discharge-start wave detecting section 31; counter (N1) 32; abnormal discharge detecting section 33; counter (N2) 34; feeble arc-discharge detecting section 35; and counter (N3) 36.

Hereinafter descriptions will be given on the waveform pattern of the signal corresponding to potential change detected by discharge detecting sensor 23 during plasma treatment operations, types of abnormal discharge that can occur with plasma treatment operations in processing room 3a, and the algorithm of abnormal-discharge detection.

Figure 4A:
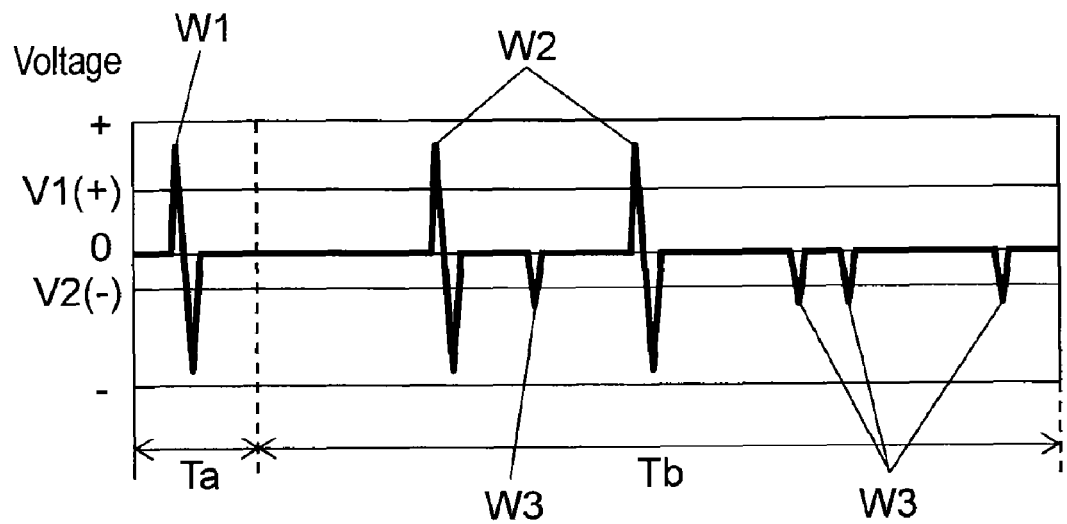
FIG. 4A shows a waveform of potential change in the plasma treatment device in accordance with the exemplary embodiment of the present invention.

FIG. 4A shows a waveform of potential change in the plasma treatment device in accordance with the exemplary embodiment of the present invention. Specifically, it shows a waveform pattern detected in a period, which is divided into early-stage monitoring time Ta counted by timer (Ta) 37 and predetermined processing time Tb counted by timer (Tb) 38, from the operation-start through the operation-end of the plasma treatment device.

Early-stage monitoring time Ta—which corresponds to an early stage of discharge start in which high-frequency power supply section 19 has been turned on—represents the monitoring time for judging whether plasma discharge normally starts or not in processing room 3a. If a waveform indicating normal discharge is not detected by the end of early-stage monitoring time Ta, a retry process for starting discharge again is carried out, as will be described later. On the other hand, predetermined processing time Tb represents a duration time of plasma treatment determined differently for each object to be processed.

Processing-time measurement section 39 measures a net running time where an object actually undergoes plasma treatment. Upon the moment high-frequency power supply section 19 is turned on, processing-time measurement section 39 starts time count, and it completes or stops the time count upon the turned-off of high-frequency power supply section 19.

The waveform detected in early-stage monitoring time Ta exhibits a typical pattern indicating changes in the condition of plasma discharge at a start of application of high-frequency power supply. As is shown in FIG. 4A, waveform W1 firstly exhibits a large swing on both sides of positive and negative and then returns to a steady-state value. Waveform W1 is detected by discharge-start wave detecting section 31. That is, discharge-start wave detecting section 31 detects waveform W1 of potential change indicating the normal start of plasma discharge in processing room 3a with reference to signal data recorded in memory 20c. Waveform W1 is detected as a result of exceeding first threshold V1 (+) determined on the side of positive voltage within early-stage monitoring time Ta counted by timer (Ta) 37.

Figure 4B:
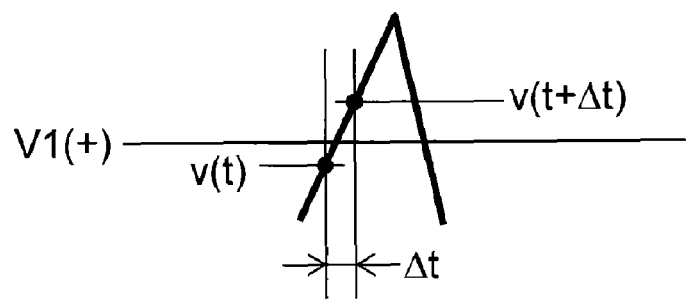
FIG. 4B shows another waveform of potential change in the plasma treatment device in accordance with the exemplary embodiment of the present invention.

FIG. 4B shows another waveform of potential change in the plasma treatment device in accordance with the exemplary embodiment of the present invention. In FIG. 4B, discharge-start wave detecting section 31 reads a predetermined voltage value from memory 20c by sampling time $\Delta t$ to check whether the following relational expression is satisfied or not: $v(t)<V1(+)<v(t+\Delta t)$. Each time it is satisfied, counter 32 has an increment and the calculated result is transmitted to device control section 40 as count value N1.

The focus of monitoring in predetermined processing time Tb is on detecting a waveform of potential change caused by an abnormal phenomenon, such as abnormal discharge and feeble arc discharge. Abnormal discharge is an unwanted discharge generated between electrode section 5 and substrate 9 mounted on electrode section 5. This can occur, for example, in a case where substrate 9 and insulator 7 have a gap therebetween when substrate 9 is mounted on electrode section 5 due to warpage or deformation in substrate 9. FIG. 4A shows the waveform of potential change over time in probe electrode 22b. That is, like waveform W1, waveform W2 exhibits a large swing on both sides of positive and negative and then returns to a steady-state value.

Waveform W2 is detected by abnormal discharge detecting section 33. That is, abnormal discharge detecting section 33 detects waveform W2 of potential change caused by abnormal discharge in processing room 3a, with reference to signal data temporarily recorded in memory 20c. Waveform W2 is detected as a result of exceeding first threshold V1 (+) on the side of positive voltage within predetermined processing time Tb counted by timer (Tb) 38. That is, as shown in FIG. 4B, abnormal discharge detecting section 33 reads a predetermined voltage value from memory 20c by sampling time $\Delta t$ to check whether the following relational expression is satisfied or not: $v(t)<V1(+)<v(t+\Delta t)$. Each time it is satisfied, counter 34 has an increment and the calculated result is transmitted to device control section 40 as count value N2.

Next, feeble arc discharge is described. Feeble arc discharge is a weak discharge that is generated between a section to which high-frequency voltage is applied in processing room 3a, such as electrode section 5 and guide member 8, and a surrounding section with ground potential. For example, foreign matters can be generated in the plasma treatment process. If they are stuck on guide member 8 for guiding substrate 9 and opening 1a, insulation quality is degraded, which causes the aforementioned feeble arc discharge.

Particularly, side surfaces of guide member 8 and inner side of opening 1a—where there is little influence of eliminating foreign matters by plasma radiation from upward—easily allow fine particles of resin or metal, which have been removed from the object by sputtering of plasma treatment, to be attached and accumulated. As a result, insulation quality degrades in such areas, inviting feeble arc discharge between the areas and base 1 connected to the ground. The waveform of potential change over time in probe electrode 22b corresponding to this case is shown as waveform W3 in FIG. 4A. Waveform W3 has a pattern that exhibits a small swing on the side of negative (or positive according to discharge characteristics) and then returns to a steady-state value. This is because feeble arc discharge has less influence on the condition of plasma discharge in processing room 3a.

Such a feeble arc discharge is detected by feeble arc-discharge detecting section 35. That is, feeble arc-discharge detecting section 35 detects waveform W3 of potential change with feeble arc discharge caused by foreign matters attached or accumulated in processing room 3a, with reference to signal data temporarily recorded in memory 20c. Waveform W3 is detected as a result of exceeding second threshold V2 (−) (where, second threshold V2 has an absolute value smaller than that of first threshold V1) on the side of negative voltage within predetermined processing time Tb.

Figure 4C:
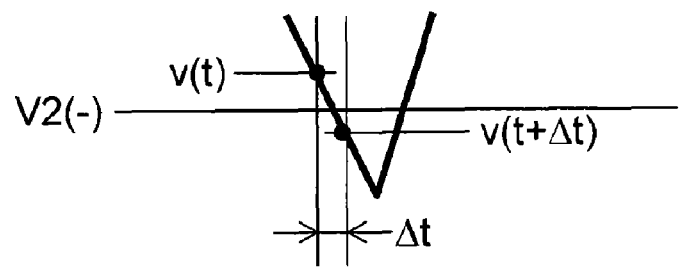
FIG. 4C shows still another waveform of potential change in the plasma treatment device in accordance with the exemplary embodiment of the present invention.

FIG. 4C shows still another waveform of potential change in the plasma treatment device in accordance with the exemplary embodiment of the present invention. In FIG. 4C, feeble arc-discharge detecting section 35 reads a predetermined voltage value from memory 20c by sampling time $\Delta t$ to check whether the following relational expression is satisfied or not: $v(t)>V2(-)>v(t+\Delta t)$. Each time it is satisfied, counter 36 has an increment and the calculated result is transmitted to device control section 40 as count value N3. Although FIG. 4C shows the example where second threshold V2 is set on the negative voltage side, it may be set on the positive voltage side according to discharge characteristics.

Feeble arc-discharge detecting section 35 detects not only waveform W3 caused by feeble arc discharge but also waveform W2 caused by abnormal discharge, since first threshold V1 (+) has an absolute value larger than that of second threshold V2 (−). However, the detection frequency judged as serious condition is, as for waveform W2, a frequency exceeding several times within predetermined processing time Tb; whereas, as for waveform W3, a frequency exceeding a hundred times per one sec. Therefore, if feeble arc-discharge detecting section 35 has a detecting result as a mixture of waveform W2 and waveform W3, there is no inconvenience in achieving the primary purpose of detection. On the contrary, signal analysis section 30 achieves predetermined detection purpose by using a simple algorithm with no need for discriminating between waveform W2 and waveform W3. As a result, waveform detection is obtained as quick as possible in real time.

With the structure above, signal analysis section 30 detects the waveforms of potential change below:

a discharge-start waveform as a potential change with the start of discharge indicating that plasma discharge normally starts in processing room 3a;

an abnormal discharge waveform as a potential change with abnormal discharge indicating that abnormal plasma discharge occurs in processing room 3a; and a feeble arc discharge waveform as a potential change with feeble arc discharge caused by foreign matters attached or accumulated in processing room 3a.

The occurrence frequencies of the waveforms above are retained in count values N1, N2, and N3. Using the count values, signal analysis section 30 extracts index data that indicates the condition of plasma discharge.

Next, the structure and function of device control section 40 is described. Device control section 40 has discharge condition monitoring means 41, processing-history storage section 42, retry means 43, accumulative plasma processing means 44, and maintenance judgment means 45. As described earlier, device control section 40 effects control of the vacuum evacuation section formed of vacuum valve 14 and vacuum pump 17, gas supply section 16, and high-frequency power supply section 19 so as to offer normal operation control for carrying out plasma treatment. At the same time, device control section 40 judges the condition of plasma discharge in processing room 3a by monitoring index data extracted by signal analysis section 30 and carries out a predetermined process suitable for the condition of plasma discharge for proper plasma treatment operations.

Discharge condition monitoring means 41 of device control section 40 makes reference to count values N1, N2, and N3—which are acquired by counter (N1) 32, counter (N2) 34, and counter (N3) 36, respectively—as index data showing the condition of plasma discharge. That is, discharge condition monitoring means 41 monitors the condition of plasma discharge in processing room 3a. If necessary, device control section 40 effects control of each section of plasma treatment device so that each of retry means 43, accumulative plasma processing means 44, and maintenance judgment means 45 carries out the processes below.

If plasma discharge does not start normally, device control section 40 requests retry means 43 to start the retry process that repeatedly carries out the discharge-start operation. After a plasma treatment process has an interruption in the wake of detection of abnormal discharge, device control section 40 requests accumulative plasma processing means 44 to start the plasma resuming process that resumes the plasma treatment process on the currently processing object. As required, device control section 40 requests maintenance judgment means 45 to start the maintenance judgment process that judges whether taking measures against foreign matters attached or accumulated in processing room 3a is needed or not. All the processes above are not always carried out; at least any one of them should be carried out.

Device control section 40 carries out at least one of the following processes according to the condition of plasma discharge:
the retry process that repeatedly carries out the discharge-start operation when plasma discharge does not start normally;
the plasma resuming process that resumes the plasma treatment process on the currently processing object after a plasma treatment process has an interruption in the wake of detection of abnormal discharge; and
the maintenance judgment process that judges whether taking measures against foreign matters attached or accumulated in processing room 3a is needed or not.

Processing-history storage section 42 stores signal data temporarily recorded in memory 20c, and index data, such as count values N1, N2, N3, as processing-history data of the plasma treatment device. This offers details of the history data on a substrate processed by the plasma treatment device, establishing traceability for quality control and production control.

The description given hereinafter is on the process of monitoring the discharge condition in processing room 3a while an object to be processed is set in processing room 3a for plasma treatment by the plasma treatment device of the embodiment.

Figure 5:
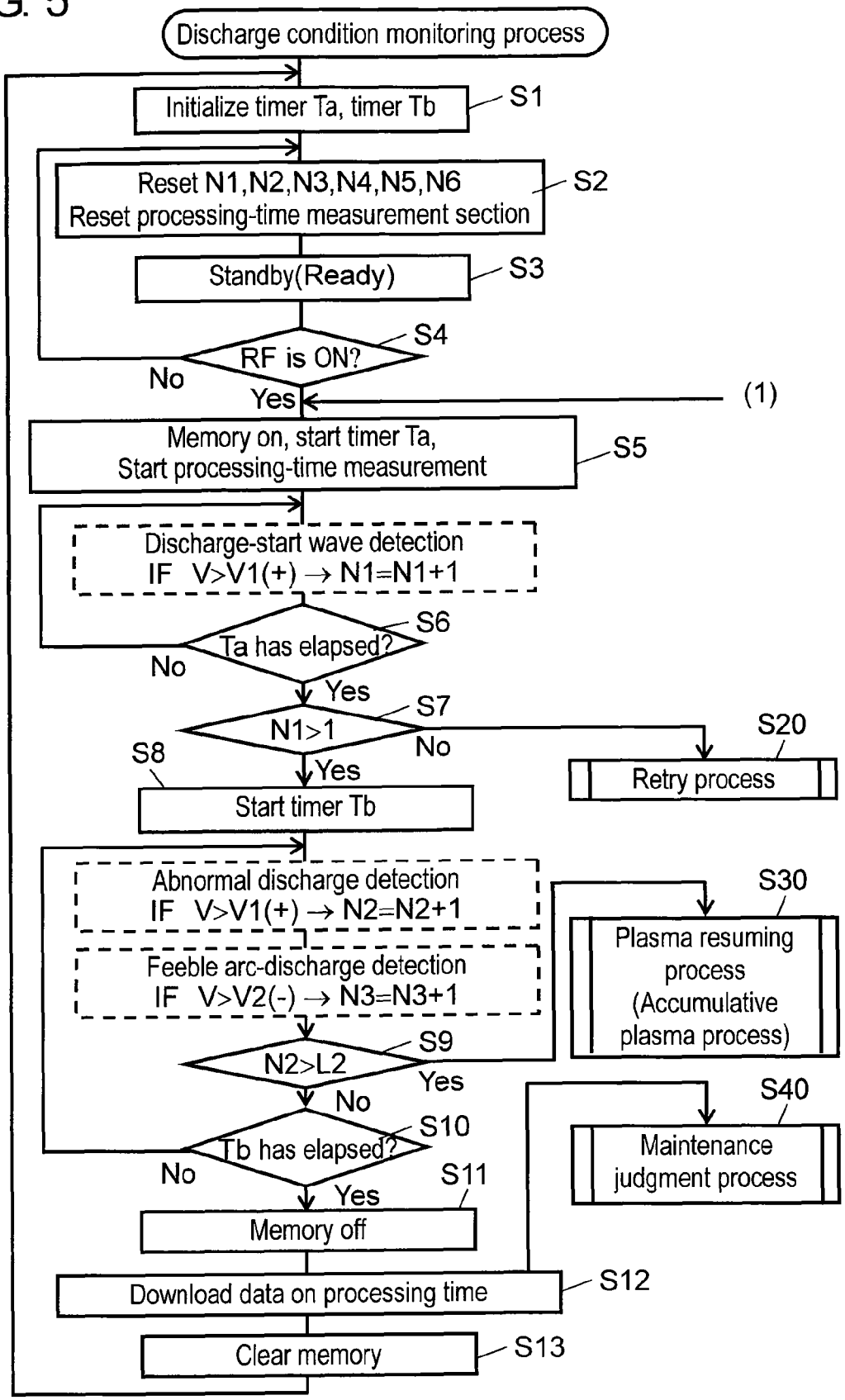
FIG. 5 is a flow chart showing the monitoring process of discharge condition in a method for plasma treatment in accordance with the exemplary embodiment of the present invention.

FIG. 5 is the flow chart showing the monitoring process of the discharge condition in the method for plasma treatment in accordance with the exemplary embodiment of the present invention. First, in FIG. 5, the system initializes early-stage monitoring time Ta counted by timer (Ta) 37 and predetermined processing time Tb counted by timer (Tb) 38 according to a predetermined empirical value and data on the characteristics of substrate 9 as an object (S1). Next, the system resets count values N1, N2, N3, N4, N5, N6 and processing-time measurement section 39 (S2). Count values N4, N5, and N6 are the values counted by the counters built in maintenance judgment means 45, accumulative plasma processing means 44, and retry means 43, respectively.

After the initializing operations above, the plasma treatment device goes into a standby mode (S3) and checks whether RF (high-frequency power supply) is turned on or not (S4). If RF is turned on (i.e., judged as 'Yes'), the system turns on memory 20c so as to be ready for writing, and at the same time, starts time measurement of early-stage monitoring time Ta counted by timer (Ta) 37 and also starts processing-time measurement of processing-time measurement section 39 (S5). The process above allows signal recording section 20 to record a signal detected by discharge detecting sensor 23. That is, receiving a signal of potential change that is caused with changes in plasma discharge and induced in probe electrode 22b of discharge detecting sensor 23, signal recording section 20 temporarily records the signal in memory 20c as signal data of potential change (the signal recording step).

After that, signal analysis section 30 extracts index data indicating the condition of plasma discharge, with reference to the signal data temporarily recorded in memory 20c (the signal analysis step). While the processing time does not reach early-stage monitoring time Ta (i.e., judged as 'No' in S6), discharge-start wave detecting section 31 of signal analysis section 30 detects a discharge-start wave (shown as waveform W1 in FIG. 4A) and carries out the counting process of detected waves. That is, each time detected voltage V exceeds first threshold V1 (+), counter 32 adds 1 to count value N1.

On a moment that early-stage monitoring time Ta has elapsed (i.e., judged as 'Yes' in S6), the system judges whether count value N1 is larger than 1 or not (S7). If N1>1 (i.e., judged as 'Yes'), the system starts time measurement of predetermined processing time Tb counted by timer 38 (S8); otherwise (i.e., judged as 'No' because N1>1 is not satisfied), the system judges that plasma discharge has not normal start and proceeds to the retry process (S20), which is shown in FIG. 6 and will be described below.

Figure 6:
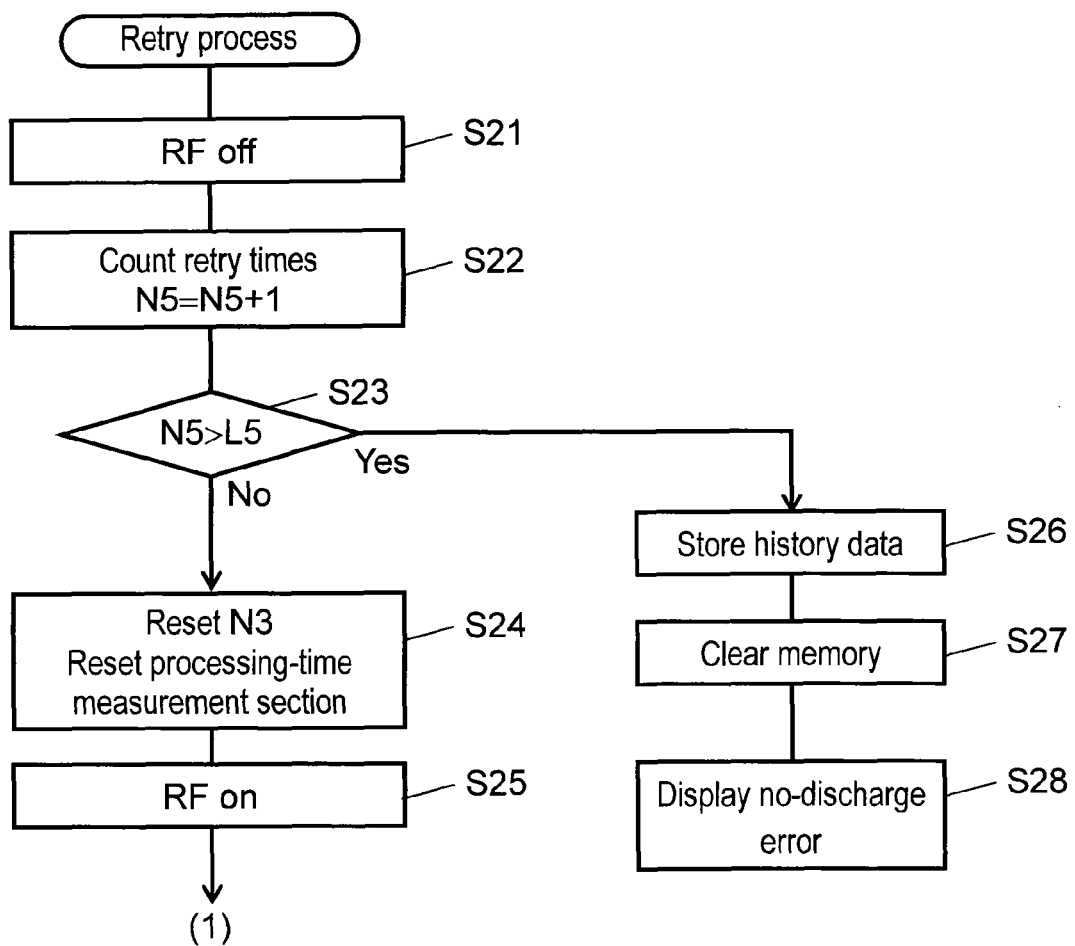
FIG. 6 is a flow chart showing the retry process for repeatedly carrying out discharge start operation in the method for plasma treatment in accordance with the exemplary embodiment of the present invention.

FIG. 6 is the flow chart showing the retry process for repeatedly carrying out the discharge start operation in the method for plasma treatment in accordance with the exemplary embodiment of the present invention. Hereinafter the retry process will be described. Retry means 43 of device control section 40 is responsible for the retry process. In FIG. 6, first, RF (high-frequency power supply) is turned off (S21), and then 1 is added to count value N5 that shows the number of retry times (S22). Next, retry means 43 checks whether count value N5 exceeds upper limit value L5 or not (S23)—where, L5 is arbitrarily set in a range from 1 to 5. If N5>L5 is not satisfied (i.e., judged as 'No'), retry means 43 resets count value N3 and processing-time measurement section 39 (S24). After that, RF (high-frequency power supply section 19) is turned on (S25), and the procedure returns to position (1) of the main flow to continue the process along the flow chart.

On the other hand, if N5>L5 (i.e., judged as 'Yes' in S23), retry means 43 judges as abnormal condition. In that case, retry means 43 stores the data recorded in memory 20c and count values in processing-history storage section 42 as history data (S26), clears memory 20c (S27), and shows an error message indicating no discharge (S28). Confirming the error message, an operator accesses to the plasma treatment device to take measures against the abnormal condition.

When plasma discharge has a normal start, the procedure goes to step S8 of FIG. 5 to start time measurement of predetermined processing time Tb counted by timer (Tb) 38. After that, until predetermined processing time Tb has elapsed (S10), abnormal discharge detecting section 33 detects abnormal discharge and carries out the counting process of detection result; at the same time, feeble arc-discharge detecting section 35 detects feeble arc discharge and carries out the counting process of detection result. Each time detected voltage V exceeds first threshold V1 (+) on the positive (+) side, counter (N2) 34 adds 1 to counter value N2. Each time detected voltage V exceeds second threshold V2 (−) on the negative (−) side, counter (N3) 36 adds 1 to counter value N3. After that, the system checks whether count value N2, which indicates frequency of occurrence of abnormal discharge, exceeds predetermined upper limit L2 (for example, L2=1 to 3) or not (S9). If N2>L2 (i.e., judged as 'Yes'), the system judges that abnormal discharge occurs beyond certain limits and proceeds to the plasma resuming process (the accumulative plasma process) shown in FIG. 7 (S30).

Figure 7:
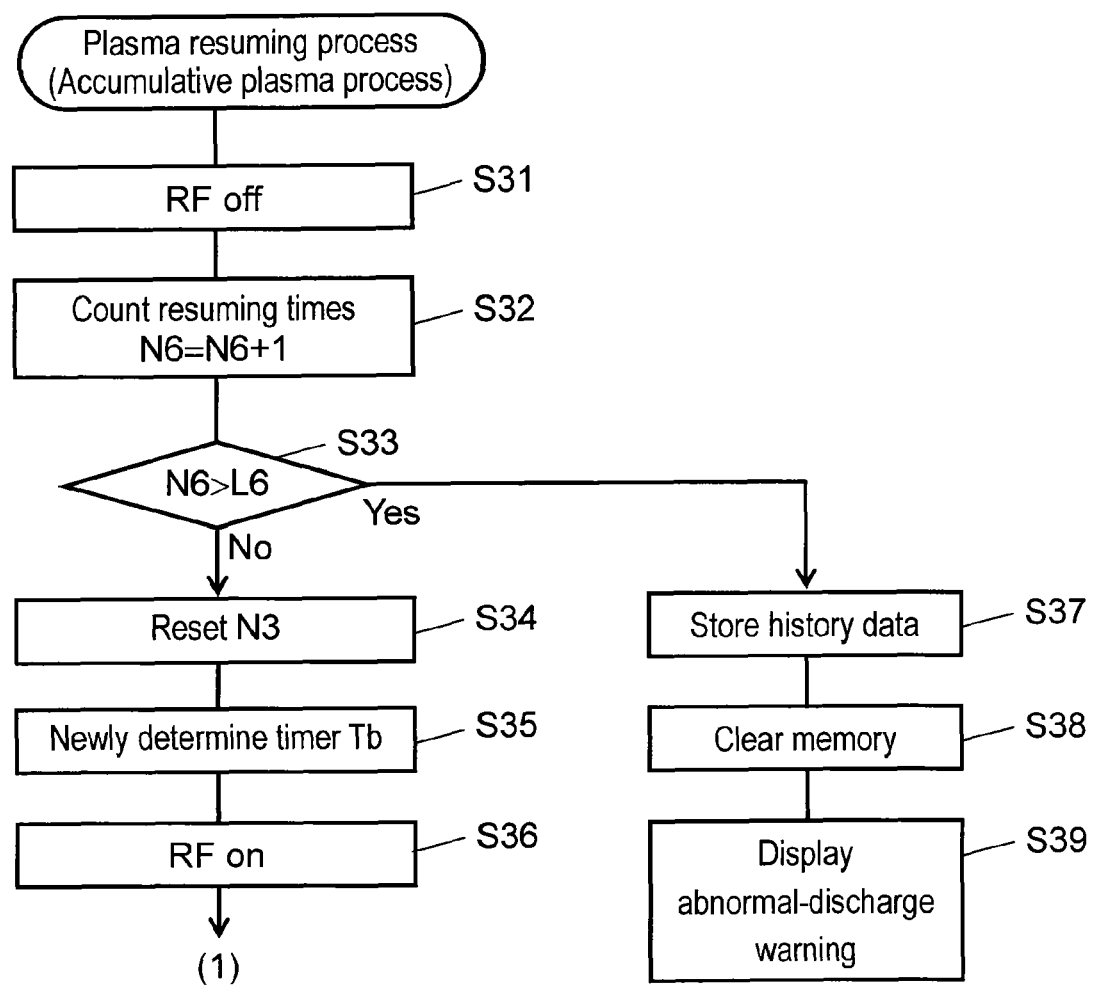
FIG. 7 is a flow chart showing the plasma resuming process for resuming plasma treatment after interruption of plasma treatment in the method for plasma treatment in accordance with the exemplary embodiment of the present invention.

FIG. 7 is the flow chart showing the plasma resuming process for resuming plasma treatment after interruption of plasma treatment in the method for plasma treatment in accordance with the exemplary embodiment of the present invention. Hereinafter the plasma resuming process (accumulative plasma process) will be described. Accumulative plasma processing means 44 of device control section 40 is responsible for the resuming process (accumulative plasma process). In FIG. 7, first, RF (high-frequency power supply) is turned off (S31), and then 1 is added to count value N6 that shows the number of resuming times (S32). Next, accumulative plasma processing means 44 checks whether count value N6 exceeds predetermined upper limit value L6 or not (S33)—where, L6 is arbitrarily set in a range from 1 to 5. If N6>L6 is not satisfied (i.e., judged as 'No'), accumulative plasma processing means 43 resets count value N3 (S34) and then newly determines predetermined processing time Tb (S35).

That is, the time required for finishing plasma treatment on substrate 9 as the current object is calculated from the processing time recorded in processing-time measurement section 39 and predetermined processing time Tb. Next, accumulative plasma processing means 44 turns on RF (high-frequency power supply) again (S36) and returns the procedure to position (1) on the main flow shown in FIG. 5 to continue the process along the flow chart. In this way, even when plasma treatment has an interruption, the object undergoes the treatment with a predetermined proper processing time.

Whether predetermined processing time Tb is newly determined or not (S35) can be predetermined as necessary. Specifically, in the resuming process, when the currently processing object requires the treatment in an absolutely constant time, predetermined processing time Tb is newly determined. On the other hand, when the object has no degradation in quality even if the processing time becomes longer than the predetermined value, predetermined processing time Tb may be not changed. If N6>L6 (i.e., judged as 'Yes' in S33), accumulative plasma processing means 44 judges as an error condition caused by recurring anomalies. In that case, accumulative plasma processing means 44 stores the data recorded in memory 20c and count values into processing-history storage section 42 as history data (S37), clears memory 20c (S38), and shows a warning message against abnormal discharge. Confirming the warning, an operator accesses to the plasma treatment device to take measures against the abnormal condition.

After that, the procedure goes back to the main flow shown in FIG. 5. When predetermined processing time Tb has elapsed (i.e., judged as 'Yes' in S10), the system turns off the writing function of memory 20c (S11), and reads the processing time obtained by processing-time measurement section 39. The data recorded in memory 20c and count values acquired during the process are downloaded to processing-history storage section 42 (S12). After memory 20c is cleared, the procedure goes back to the position before S1. According to the processing time and data obtained at S12, the system proceeds to maintenance judgment process shown in FIG. 8 (S40).

Figure 8:
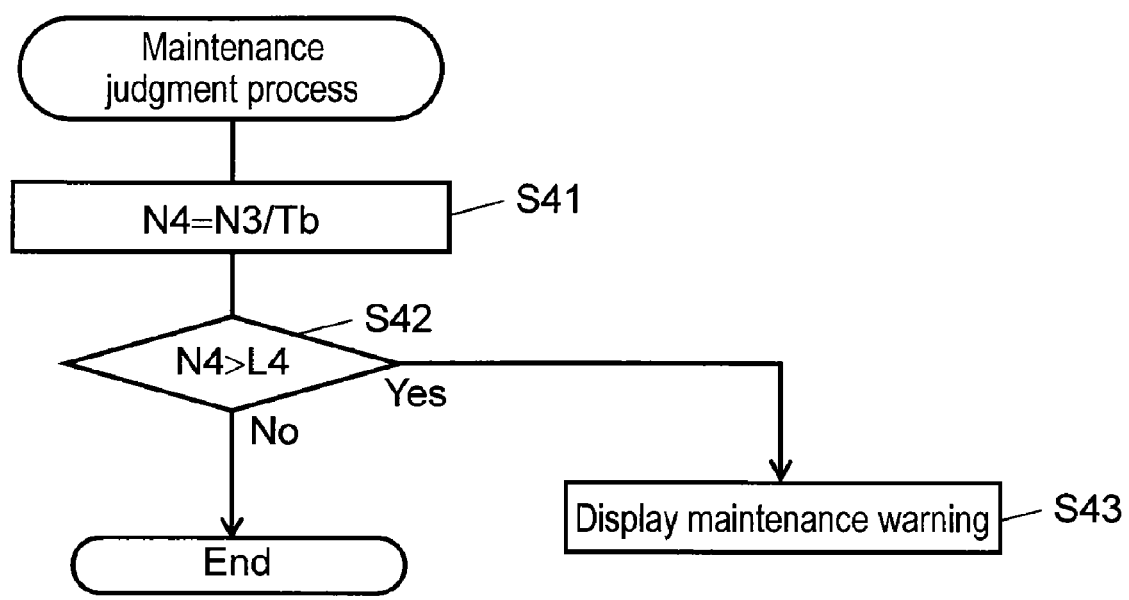
FIG. 8 is a flow chart showing the maintenance judgment process for judging whether taking measures against attachment or accumulation of foreign matters is needed or not in the method for plasma treatment in accordance with the exemplary embodiment of the present invention.

FIG. 8 is the flow chart showing the maintenance judgment process for judging whether taking measures against the foreign matters is needed or not in the method for plasma treatment in accordance with the exemplary embodiment of the present invention. In S41 of FIG. 8, to calculate the occurrence frequency of feeble arc discharge per unit time as count value N4, count value N3 is divided by predetermined processing time Tb (where, count value N3 retains the number of occurrence of feeble arc discharge). Making a comparison between calculated count value N4 and predetermined upper limit L4 (for example, 100[1/S]), the system judges whether maintenance is needed or not (S42). If count value N4 exceeds upper limit L4 (i.e., judged as 'Yes'), the system shows a maintenance warning message indicating the need for taking measures against foreign matters, such as cleaning of processing room 3a and replacement of cover members disposed inside the processing room (S43).

In the signal analysis step from S5 through S10, the following potential changes are detected:
  a potential change with the start of discharge indicating that plasma discharge normally starts in processing room 3a;
  a potential change with abnormal discharge indicating that abnormal plasma discharge occurs in processing room 3a; and
  a potential change with feeble arc discharge caused by foreign matters attached or accumulated in processing room 3a.

In the signal analysis step, calculating the occurrence frequency of each potential change allows index data indicating the condition of plasma discharge to be extracted as count values N1, N2, and N3.

In the aforementioned each processing step, device control section 40 effects control of the vacuum evacuation section formed of vacuum pump 17 and vacuum valve 14, gas supply section 16, and high-frequency power supply section 19 to carry out plasma treatment operations. Device control section 40 also constitutes a device control step. In the step, device control section 40 judges the condition of plasma discharge in processing room 3a by monitoring index data extracted by signal analysis section 30 and carries out a predetermined process suitable for the condition of plasma discharge for proper plasma treatment operations.

In the device control step, device control section 40 carries out at least one of the processes below:
- the retry process that repeatedly carries out the discharge-start operation when plasma discharge does not start normally;
- the plasma resuming process that resumes the plasma treatment process on the currently processing object after a plasma treatment process has an interruption in the wake of detection of abnormal discharge; and
- the maintenance judgment process that judges whether taking measures against foreign matters attached or accumulated in processing room 3a is needed or not.

The plasma treatment of the present invention, as described above, has the procedures below. A potential change, which is caused with change in plasma discharge and is induced in probe electrode 22b, is received as a signal, and the signal is temporarily recorded in memory 20c as signal data of potential change. Referencing the recorded signal data, signal analysis section 30 extracts index data indicating the condition of plasma discharge. Device control section 40 judges the condition of plasma discharge by monitoring the extracted index data and carries out a predetermined process according to the judgment so as to perform plasma treatment operations properly.

With the procedures above, the device properly monitors the presence or absence of plasma discharge and abnormal discharge according to the index data that indicates the condition of plasma discharge in nearly real time. This allows appropriate measures against problems or the need for maintenance to be judged on real-time basis.

INDUSTRIAL APPLICABILITY

The plasma treatment device and the plasma treatment method of the present invention provides proper judgment on the presence or absence of plasma discharge, abnormal discharge, and the need for maintenance and takes appropriate measures against problems. It is therefore useful for the field where a substrate as an object to be processed undergoes plasma treatment, such as plasma cleaning.

The invention claimed is:

1. A plasma treatment device that accommodates an object to be processed in a processing room for plasma treatment, the device comprising:
    a vacuum chamber that forms the processing room;
    an electrode section disposed in the processing room;
    a vacuum evacuation section that evacuates the processing room of air;
    a gas supply section that supplies the processing room with gas for generating plasma;
    a high-frequency power supply section that generates plasma discharge by applying high-frequency voltage to the electrode section;
    a matching device that matches an impedance of the high-frequency power supply section to an impedance of a plasma discharge circuit for generating the plasma discharge;
    a discharge detecting sensor that has at least a plate-like dielectric member fixed to the vacuum chamber so that one surface of the dielectric member faces plasma discharge generated in the processing room and a probe electrode disposed on the other surface of the dielectric member;
    a signal recording section that receives a signal indicating potential change, which is caused with changes in the plasma discharge and induced in the probe electrode, and temporarily records the signal as signal data;
    a signal analysis section that extracts index data showing a condition of the plasma discharge, with reference to the signal data recorded in the signal recording section; and
    a device control section that not only effects control of the vacuum evacuation section, the gas supply section, and the high-frequency power supply section so as to carry out plasma treatment operations, but also judges a condition of the plasma discharge by monitoring the index data extracted by the signal analysis section and carries out a predetermined process for performing the plasma treatment operations properly,
    wherein, the signal analysis section detects a potential change at a start of discharge that shows a normal start of plasma discharge in the processing room; a potential change with abnormal discharge that shows generation of abnormal plasma discharge in the processing room; and a potential change with a feeble arc-discharge caused by foreign matters attached or accumulated in the processing room, at the same time, the signal analysis section extracts the index data by calculating occurrence frequency of the potential changes,
    and the device control section carries out at least one of following processes: a retry process for repeatedly carrying out discharge-start operations when the plasma discharge has not a normal start; a plasma resuming process for resuming plasma treatment on a currently processing object after interruption of plasma treatment due to detection of the abnormal discharge; and a maintenance judgment process for judging whether taking measures against attachment or accumulation of the foreign matters is needed or not.

2. The plasma treatment device of claim 1 further including:
    a processing-history storage section that stores the index data as processing-history data obtained by the plasma treatment device.

3. A method for plasma treatment of an object comprising, providing a plasma treatment device having
    a vacuum chamber that forms a processing room;
    an electrode section disposed in the processing room;
    a vacuum evacuation section that evacuates the processing room of air;
    a gas supply section that supplies the processing room with gas for generating plasma;
    a high-frequency power supply section that generates plasma discharge by applying high-frequency voltage to the electrode section;
    a matching device that matches an impedance of the high-frequency power supply section to an impedance of a plasma discharge circuit for generating the plasma discharge;
    a discharge detecting sensor that has at least a plate-like dielectric member fixed to the vacuum chamber so that one surface of the dielectric member faces plasma discharge generated in the processing room and a probe electrode disposed on the other surface of the dielectric member;
    a signal recording step that receives a signal indicating potential change, which is caused with changes in the plasma discharge and induced in the probe electrode, and temporarily records the signal as signal data indicating the potential change;
    a signal analysis step that extracts index data showing a condition of the plasma discharge, with reference to the signal data recorded in the signal recording section; and
    a device control step that not only effects control of the vacuum evacuation section, the gas supply section, and the high-frequency power supply section so as to carry out plasma treatment operations, but also judges a condition of the plasma discharge by monitoring the index data extracted by the signal analysis step and carries out a predetermined process for performing the plasma treatment operations properly, wherein, the signal analysis step detects a potential change at a start of discharge that shows a normal start of plasma discharge in the processing room; a potential change with abnormal discharge that shows generation of abnormal plasma discharge in the processing room; and a potential change with a feeble arc-discharge caused by foreign matters attached or accumulated in the processing room, at the same time, the signal analysis section extracts the index data by calculating occurrence frequency of the potential changes, and the device control step carries out at least one of following processes: a retry process for repeatedly carrying out discharge start operations when the plasma discharge has not a normal start; a plasma resuming process for resuming plasma treatment on a currently processing object after interruption of plasma treatment due to detection of the abnormal discharge; and a maintenance judgment process for judging whether taking measures against attachment or accumulation of the foreign matters is needed or not.

* * * * *